(12) United States Patent
Kohara

(10) Patent No.: US 7,593,274 B2
(45) Date of Patent: Sep. 22, 2009

(54) SEMICONDUCTOR INTEGRATED CIRCUIT AND RELIEF METHOD AND TEST METHOD OF THE SAME

(75) Inventor: Koji Kohara, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 105 days.

(21) Appl. No.: 11/953,623

(22) Filed: Dec. 10, 2007

(65) Prior Publication Data

US 2008/0137446 A1    Jun. 12, 2008

(30) Foreign Application Priority Data

Dec. 11, 2006    (JP)    ............................... 2006-333392

(51) Int. Cl.
*G11C 7/00*    (2006.01)
(52) U.S. Cl. .................. 365/200; 365/201; 365/189.07; 365/225.7

(58) Field of Classification Search ................. 365/200, 365/201, 189.07, 225.7, 189.02
See application file for complete search history.

(56) References Cited

U.S. PATENT DOCUMENTS 6,388,929 B1 *    5/2002    Shimano et al. ............. 365/201

* cited by examiner

*Primary Examiner*—David Lam
(74) *Attorney, Agent, or Firm*—Turocy & Watson, LLP

(57) ABSTRACT

A semiconductor integrated circuit is disclosed, which includes a plurality of memory circuits in which defective columns are relievable, mounted on one chip, each of the memory circuits having a multi-bit structure, a plurality of comparison circuit which are connected to output sides of the respective memory circuits, and compare multi-bit memory data items output from the associated memory circuits with multi-bit expected data, a logic circuit which consolidates multi-bit comparison results output from the comparison circuits, a replacement analysis circuit which is shared between the memory circuits, performs replacement analysis by processing multi-bit data output from the logic circuit, and generates relief information to relief the memory circuits, and a nonvolatile storage circuit which stores the relief information, and performs relief for the memory circuits by using the relief information.

20 Claims, 4 Drawing Sheets

SEMICONDUCTOR INTEGRATED CIRCUIT AND RELIEF METHOD AND TEST METHOD OF THE SAME

CROSS-REFERENCE TO RELATED APPLICATIONS

This application is based upon and claims the benefit of priority from prior Japanese Patent Application No. 2006-333392, filed Dec. 11, 2006, the entire contents of which are incorporated herein by reference.

BACKGROUND OF THE INVENTION

1. Field of the Invention

The present invention relates to a semiconductor integrated circuit, a method of relieving the same, and a method of testing the same, in particular, an LSI equipped with a plurality of memory circuits and a built-in replacement analysis circuit which generates memory relief information, a method of relieving the same, and a method of testing the same, which are used for LSIs equipped with a plurality of SRAMs or the like.

2. Description of the Related Art

Recently, to deal with increase in defect rate of LSIs caused by miniaturization in the manufacturing process of LSIs, there is a tendency of equipping even memory circuits of relatively small capacity with a redundancy (R/D) mechanism. If R/D rate of the memory increases, additional circuits are provided, such as a fuse circuit, which stores relief information in a fuse, a comparison circuit, a BIRA (built-in replacement and analyzing) circuit which generates memory relief information, etc.

In prior art, an LSI equipped with a plurality of SRAMs has a structure in which one comparison circuit, one BIRA circuit, and one fuse circuit are provided for each SRAM, to simultaneously perform test and replacement analysis for the SRAMs for the purpose of efficiently performing test. However, this increases the size of additional circuits. Therefore, there is the problem that the number of the additional circuits also increases as the number of memory circuits mounted on one LSI chip increases.

Jpn. Pat. Appln. KOKAI Pub. No. 2003-319298 discloses a technique of performing redundant analysis for a plurality of memory circuits one by one (serially), which share a BIST (built-in test) circuit and a BIRA circuit. Further, although Jpn. Pat. Appln. KOKAI Pub. No. 2003-151293 discloses a technique of replacing the same line in the DRAM, the technique cannot be used for dealing with a plurality of memories.

BRIEF SUMMARY OF THE INVENTION

According to a first aspect of the present invention, there is provided a semiconductor integrated circuit comprising:

a plurality of memory circuits in which defective columns are relievable, mounted on one chip, each of the memory circuits having a multi-bit structure;

a plurality of comparison circuit which are connected to output sides of the respective memory circuits, and compare multi-bit memory data items output from the associated memory circuits with multi-bit expected data;

a logic circuit which consolidates multi-bit comparison results output from the comparison circuits;

a replacement analysis circuit which is shared between the memory circuits, performs replacement analysis by processing multi-bit data output from the logic circuit, and generates relief information to relief the memory circuits; and a nonvolatile storage circuit which stores the relief information, and performs relief for the memory circuits by using the relief information.

According to a second aspect of the present invention, there is provided a method of relieving a semiconductor integrated circuit comprising:

comparing a plurality of multi-bit memory data items output from a plurality of memory circuits of a multi-bit structure mounted on one chip with multi-bit expected data to acquire multi-bit comparison results for the memory circuits, consolidating the multi-bit comparison results output from the comparison circuits to acquire a logic value data of a multi-bit structure, performing replacement analysis for the memory circuits based on the logic value data output from the logic circuit to generate relief information to relief the memory circuits, storing the relief information in a nonvolatile storage circuit, and perform relief for the memory circuits by using the relief information stored in the nonvolatile storage circuit.

According to a third aspect of the present invention, there is provided a method of testing a semiconductor integrated circuit, the semiconductor integrated circuit including a plurality of memory circuits in which defective columns are relievable, mounted on one chip, each of the memory circuits having a multi-bit structure; a plurality of comparison circuit which are connected to output sides of the respective memory circuits, and compare multi-bit memory data items output from the associated memory circuits with multi-bit expected data; a logic circuit which consolidates multi-bit comparison results output from the comparison circuits; a replacement analysis circuit which is shared between the memory circuits, performs replacement analysis by processing multi-bit data output from the logic circuit, and generates relief information to relief the memory circuits; and a nonvolatile storage circuit which stores the relief information, and performs relief for the memory circuits by using the relief information, wherein the comparison circuits are supplied with respective control signals, individually controlled by the control signals, and forcibly set the multi-bit comparison results to matched data when the control signals are in an inactive state, the replacement analysis circuit individually performs the replacement analysis for the memory circuits by individual activation of the comparison circuits by the control signals, and generate the relief information items to relief the memory circuits, and the nonvolatile storage circuit includes a plurality of nonvolatile storage elements which individually store respective relief information items, in which the memory circuits are simultaneously tested, it is determined based on a result of the simultaneous test whether the memory circuits are to be individually tested, and the memory circuits are individually tested when it is determined that the memory circuits are to be individually tested.

DETAILED DESCRIPTION OF THE INVENTION

Figure 1:
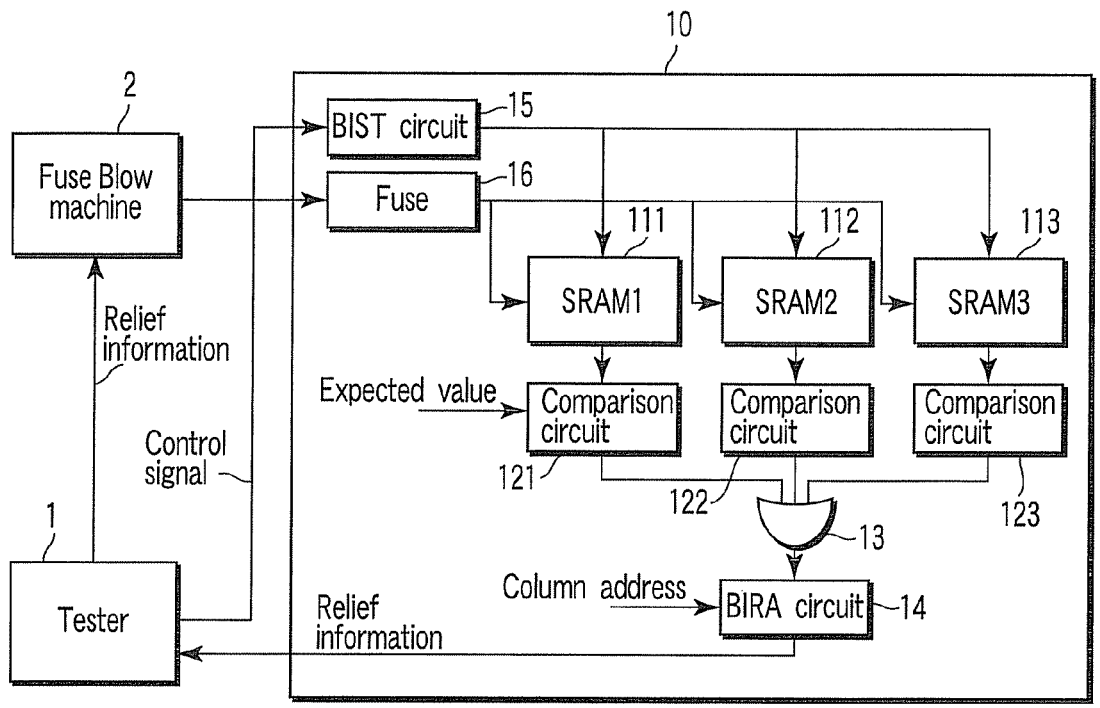
FIG. 1 is a block diagram illustrating a part of a memory LSI and a system configuration of a test method of the memory LSI according to a first embodiment of the present invention.

Embodiments of the present invention are explained below with reference to drawings. In the explanation, like reference numerals denote like constituent elements through the drawings.

First Embodiment

Figure 2:
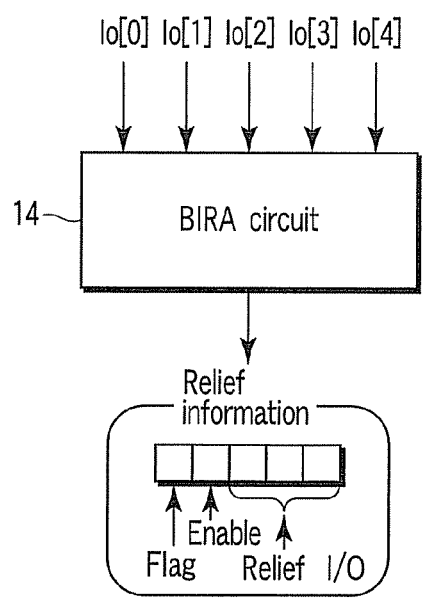
FIG. 2 is a diagram illustrating an example of a structure and output information of a BIRA circuit illustrated in FIG. 1.
Figure 3:
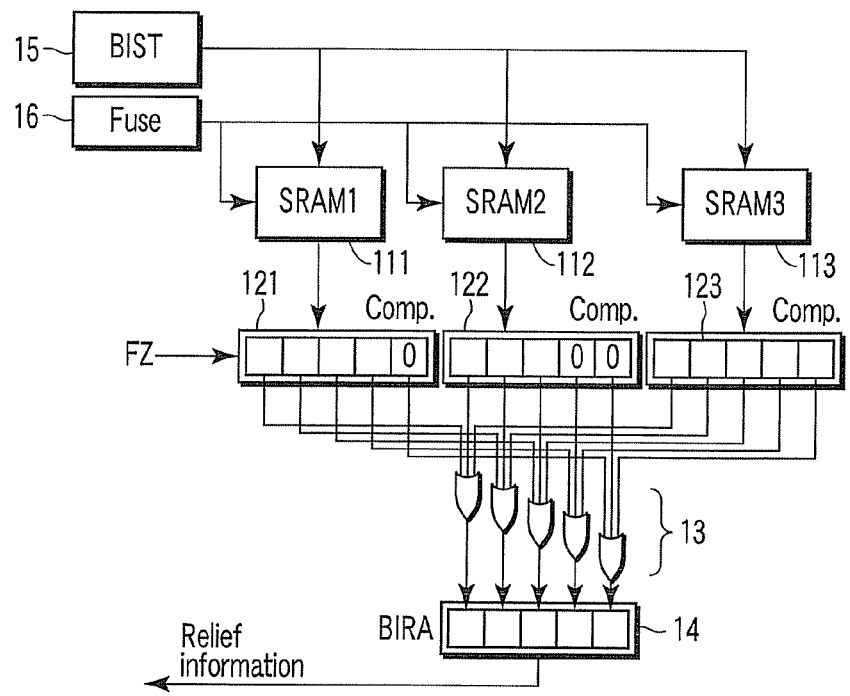
FIG. 3 is a schematic circuit diagram illustrating a specific example of structures of a comparison circuit, a logic circuit, and the BIRA circuit illustrated in FIG. 1.

FIG. 1 is a block diagram illustrating a part of a memory LSI of a semiconductor integrated circuit according to a first embodiment of the present invention, and a system configuration of a test method thereof. FIG. 2 illustrates an example of a structure and output information of a BIRA circuit illustrated in FIG. 1. FIG. 3 illustrates a specific example of structures of a comparison circuit, a logic circuit, and the BIRA circuit illustrated in FIG. 1.

In FIGS. 1 to 3, an LSI chip is equipped with a plurality of memory circuits (SRAMs in this example), each having a multi-bit structure in which relief is possible for defective bits in the I/O direction, i.e., in the column direction. The SRAMs are divided into groups. In this embodiment, one group of the SRAMs is shown. The group includes three SRAMs (SRAM1, SRAM2, and SRAM3) 111 to 113.

Further, comparison circuits 121 to 123 are provided on output sides of the SRAMs 111 to 113, respectively, to simultaneously perform test and replacement analysis for the SRAMs (SRAM1, SRAM2, and SRAM3) 111 to 113 of each group, for the purpose of efficiently perform test of the LSI. Further, there are provided one logic circuit 13, one BIRA circuit 14, one BIST (built-in test) circuit 15, and a fuse circuit 16 being a nonvolatile storage circuit, which are shared between the SRAMs 111 to 113.

Each comparison circuit 121 to 123 is supplied with a control signal FZ. Each comparison circuit 121 to 123 is activated when the control signal FZ is in an active state "0", and compares, bit by bit, multi-bit expected value data supplied from the BIST circuit 15 with multi-bit output data output from the corresponding SRAM 111 to 113. Then, each comparison circuit 121 to 123 outputs data "0" or "1" in accordance with "match (good)" or "not match (bad)", as a comparison result for each bit. The multi-bit comparison output data items output from the comparison circuits 121 to 123 are input to the logic circuit 13. As illustrated in FIG. 3, the logic circuit 13 performs logical operation for bits corresponding to each other between the multi-bit comparison output data items output from the comparison circuits 121 to 123, and generates multi-bit output data. As the logic circuit 13, an OR circuit or an AND circuit is used according to positive logic operation or negative logic operation is performed. In this example, an OR circuit is used.

The multi-bit logical output data output from the logic circuit 13 is input to the BIRA circuit 14, and replacement analysis is performed therein. The replacement analysis is performed for logical outputs for test results of the SRAMs 111 to 113 such that a defective bits in the I/O direction, i.e., in the column direction is detected and the replacement analysis of the defective column are simultaneously performed for the SRAMs 111 to 113.

FIG. 2 illustrates an example of the BIRA circuit 14 of FIG. 1, to which 5 bits of I/O data items Io[0] to Io[4] are input from the logic circuit 13, and an example of output information thereof. As described above, the BIRA circuit 14 performs replacement analysis based on the multi-bit logic output data (I/O data) of the logic circuits 13. As a result of the replacement analysis, if relief is impossible, a flag bit indicating it is output. If relief is possible, a flag bit indicating it and relief information (enable bit+relief I/O address data) are output. To deal with column relief of SRAMs, necessary information including column address information is input to the BIRA circuit 14 from the BIST circuit 15.

If there are many defects of different I/Os in the SRAMs 111 to 113, relief by the BIRA circuit 14 is impossible. However, the possibility that defects exist is low in SRAMs of small capacity, and thus it is rare that relief is impossible. If relief is possible, all the SRAMs 111 to 113 can be relieved by relief information generated by the BIRA circuit 14. Therefore, no problem is caused by inputting the same information to the SRAMs 111 to 113, and the SRAMs 111 to 113 are relieved by preparing (connecting) only one common fuse circuit 16 for the SRAMs 111 to 113 in the LSI.

Next, explained is an example of testing operation and relief processing for the memory LSI illustrated in FIGS. 1 to 3. When the LSI is tested, the BIST circuit 15 and the BIRA circuit 14 are connected to a tester 1 located outside the LSI, and a fuse blow machine 2 is prepared outside the LSI to blow the fuse in the fuse circuit 16. Then, by access by the BIST circuit 15 based on control by the tester 1, output data items from the SRAMs 111 to 113 are input to the corresponding comparison circuits 121 to 123, respectively. Each comparison circuit 121 to 123 is activated when the control signal FZ supplied to them is in the active state "0". Each comparison circuit 121 to 123 compares, bit by bit, data output from the corresponding SRAM 111 to 113 with an expected value input from the BIST circuit 15, outputs "0" when the bit matches the expected value, and outputs "1" when the bit does not match the expected value. The logic circuit 13 performs AND operation for bits corresponding to each other between the multi-bit comparison output data items output from the comparison circuit 121 to 123 and generates a multi-bit output data items, and the data items output from the logic circuit 13 are input to the BIRA circuit 14. The SRAMs 111 to 113 may have the same bit width or different bit widths. If the SRAMs 111 to 113 have different bit widths, dummy bits "0" may be set for surplus output bits of comparison circuits corresponding to SRAMs having smaller bit widths in the SRAMs 111 to 113, as illustrated in FIG. 3. Instead, the circuit structure may be modified to not perform AND for bits of the surplus part, and the size of the circuit is more reduced by not performing AND for bits of the surplus part.

Relief information output from the BIRA circuit 14 is temporarily read out to the tester 1 located outside the LSI, and transmitted to the fuse blow machine 2 located outside the LSI. Relief is performed by blowing out the fuse of the fuse circuit 16 by the fuse blow machine 2. The relief information stored in the fuse is read out when the LSI is powered on, and set in the SRAMs 111 to 113.

According to the above first embodiment, the comparison circuits 121 to 123, the logic circuit 13, and the BIRA circuit 14 are added to the LSI, an AND output of defect detection results of the SRAMs 111 to 113 is input to the BIRA circuit 14, and thereby the BIRA circuit 14 can perform replacement analysis to replace defects of all the SRAMs 111 to 113.

Therefore, even if the number of memory circuits having redundancy replacement function increases, increase in the size of the BIRA circuit is suppressed to a minimum.

Although the external tester 1 is supposed to perform control to achieve the test flow in the above embodiment, it can be easily realized that the above control is automatically performed in the LSI by controlling the control signal FZ by the BIST circuit 15.

Second Embodiment

Figure 4:
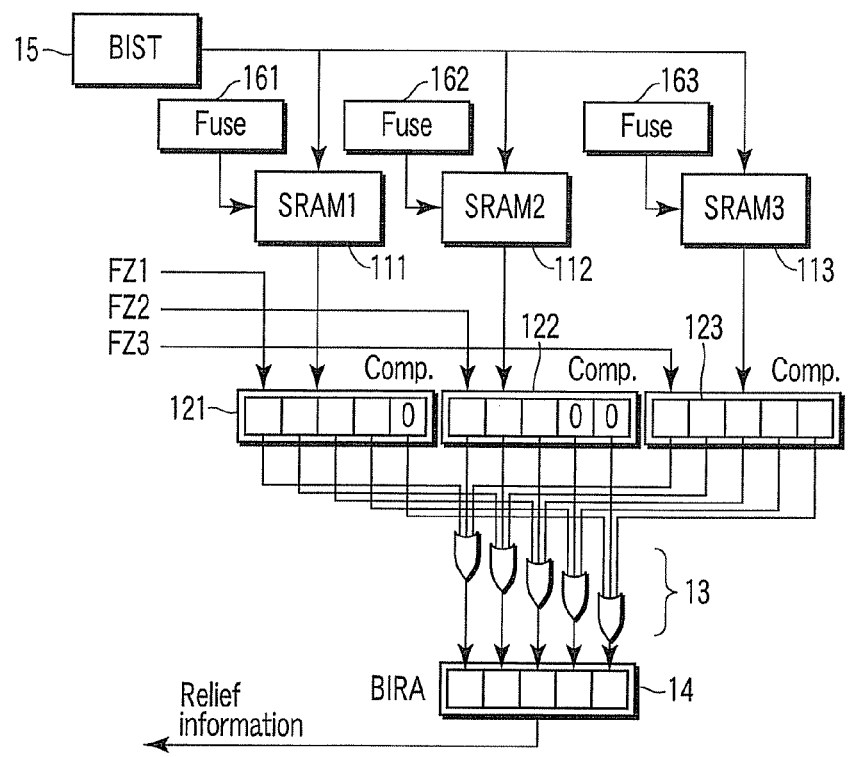
FIG. 4 is a block diagram illustrating a specific example of a part of a structure of a memory LSI according to a second embodiment of the present invention.

FIG. 4 illustrates a specific example of a part of a structure of a memory LSI according to the second embodiment of the present invention. The LSI illustrated in FIG. 4 is different from the LSI of the first embodiment in that three fuse circuits 16 are used, control signals FZ1 to FZ3 are used for performing control to simultaneously or selectively use three comparison circuits 121 to 123, and different in the test sequence. The other parts of the LSI of FIG. 4 are the same as those of the LSI of the first embodiment.

Comparison circuits 121 to 123 have an additional function of setting all the comparison output bits to the state "0" when the corresponding control signal FZ1 to FZ3 is in the inactive state "1". Thereby, when the SRAMs 111 to 113 are simultaneously tested, i.e., column defect tested, and subjected to replacement analysis of defective columns as in the first embodiment, the control signals FZ1 to FZ3 are to be set to the active state "0". In comparison with this, when the SRAMs 111 to 113 are individually (successively) tested and subjected to replacement analysis, selective control should be performed to set one of the control signals FZ1 to FZ3 to the active state "0", and the others to the inactive state "1". Thereby, it is possible to relieve the selected SRAM by the corresponding fuse circuit, and individual relief can be performed for each SRAM.

Thereby, it is possible to perform replacement analysis, with improved relief efficiency in comparison with the first embodiment.

Figure 5:
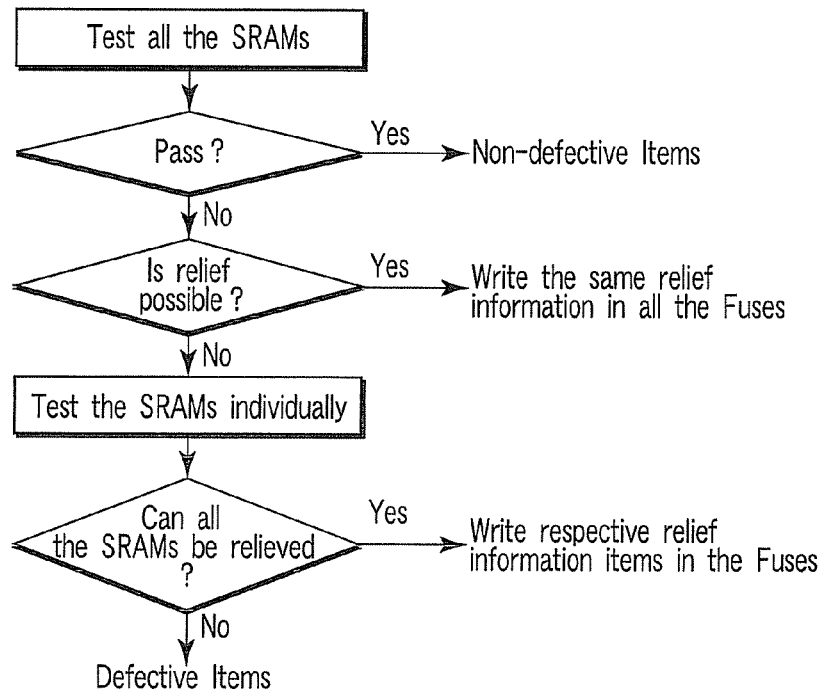
FIG. 5 is a diagram illustrating a test flow of the memory LSI of FIG. 4.

FIG. 5 illustrates an example of a test flow of the memory LSI of FIG. 4. First, test is performed for a result of AND of the corresponding bits of outputs of all the SRAMs, to simultaneously test all the SRAMs. If the result of the test is good (passed), the SRAMs are determined as non-defective items. If the result of the test is not good (failure), replacement analysis is performed. In the first analysis, as in the first embodiment, all the control signals FZ1 to FZ3 are set to the active state "0", and all the SRAMs are simultaneously subjected to replacement analysis. If it is determined that relief is possible as a result of the replacement analysis, the same relief information is written in all the fuse circuits, and thereby all the SRAMs can be relieved and dealt as non-defective items.

In comparison with this, if it is determined as a result of simultaneous test that relief is impossible, the SRAMs are individually (successively) tested and subjected to replacement analysis. As a result, if it is determined that all the SRAMs can be relieved, relief information obtained by the individual test is written in the fuse circuit corresponding to the tested SRAM, and thereby all the SRAMs can be relieved and dealt as non-defective items. If it is determined as a result of the individual test that relief is impossible, the SRAMs are determined as defective items.

Although control to achieve the above test flow is supposed to be performed by an external tester in the above embodiment, it can be easily realized that the above control is automatically performed in the LSI by controlling the control signals FZ1 to FZ3 by the BIST circuit 15.

Third Embodiment

Figure 6:
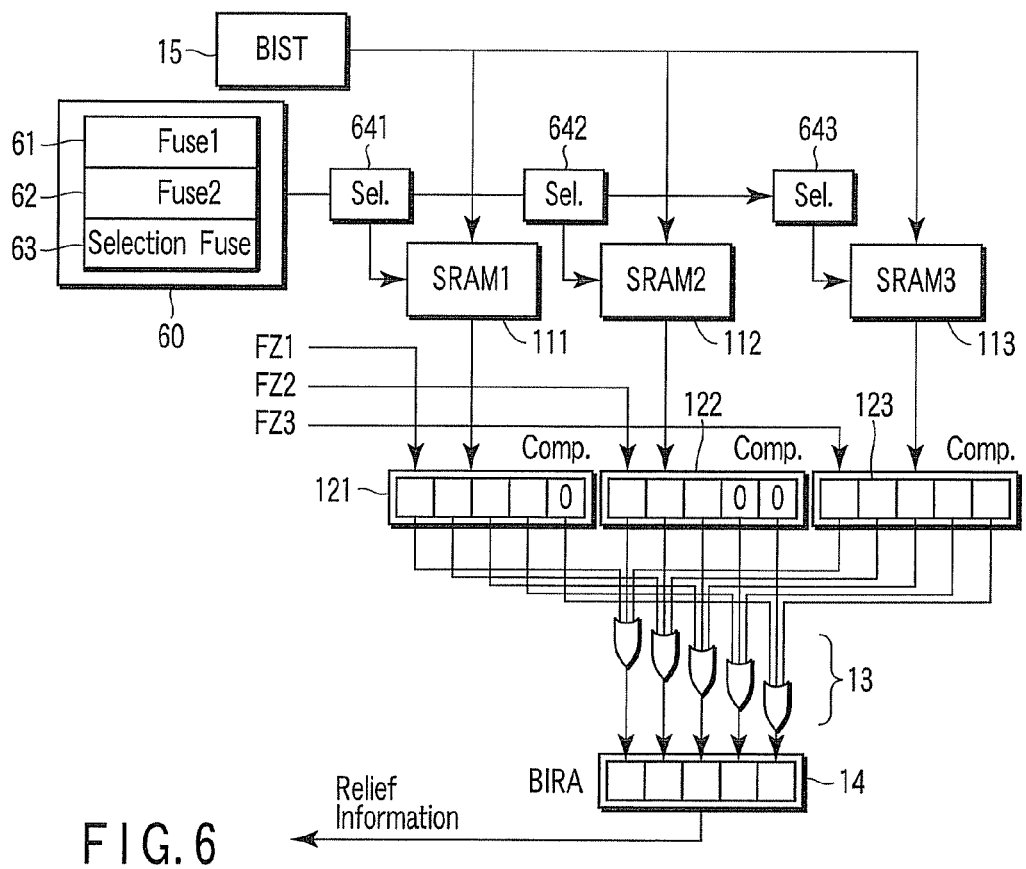
FIG. 6 is a block diagram illustrating a specific example of a part of a structure of a memory LSI according to a third embodiment of the present invention.

The number of actual defects in SRAMs is small. Therefore, in the third embodiment, the number of fuse circuits is reduced to be smaller than the number of SRAMs. FIG. 6 illustrates a specific example of a part of a structure of a memory LSI according to the third embodiment of the present invention. The LSI of FIG. 6 is different from the LSI of the second embodiment in the structure of the fuse circuit 60, existence of selection circuits 641 to 643 provided for the SRAMs 111 to 113, respectively, and in the test sequence. The other parts of the LSI of FIG. 6 are the same as those of the LSI of the second embodiment.

A fuse circuit 60 has two fuse circuits (Fuse 1, Fuse 2) 61 and 62, which is smaller than the number of SRAMs, and a selection fuse 63 which stores fuse selection data indicating which fuse data (relief information) of the two fuse circuits is to be used. The selection circuits (Sel.) 641 to 643 actually select to which of the three SRAMs 111 to 113 the fuse data selected by the selection fuse 63 is supplied. The area occupied by the selection fuse 63 and the selection circuits 641 to 643 is much smaller than the area occupied by the fuse circuits 61 and 62.

According to the above structure, it is possible to reduce the number of fuse circuits, with relief efficiency close to the relief efficiency of the second embodiment.

Figure 7:
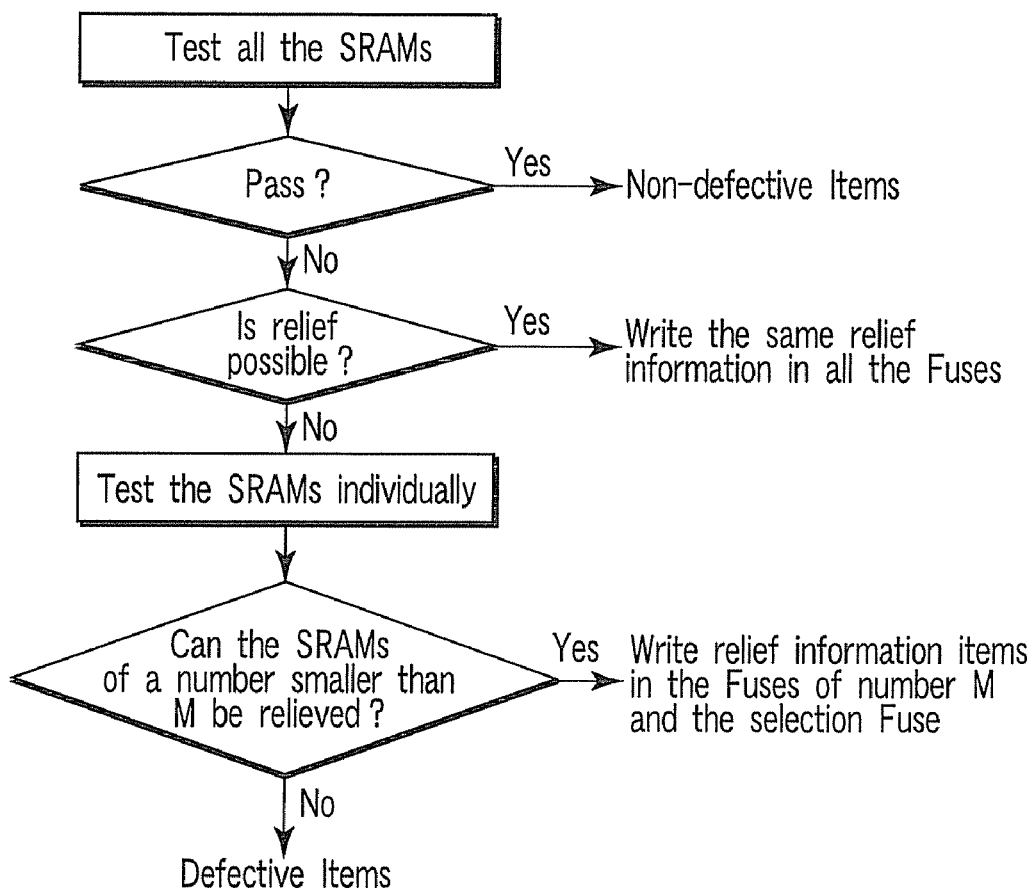
FIG. 7 is a diagram illustrating a test flow of the memory LSI of FIG. 6.

FIG. 7 illustrates an example of a test flow of the memory LSI illustrated in FIG. 6. First, test is performed for a result of AND of the corresponding bits of outputs of all the SRAMs, to simultaneously test all the SRAMs 111 to 113. If the result of the test is good (passed), the SRAMs are determined as non-defective items. If the result of the test is not good (failure), replacement analysis is performed. In the first analysis, as in the second embodiment, all the control signals FZ1 to FZ3 are set to the active state "0", and all the SRAMs are simultaneously subjected to replacement analysis. If it is determined that relief is possible as a result of the replacement analysis, the same relief information is written in all the fuse circuits, and thereby all the SRAMs can be relieved and dealt as non-defective items.

In comparison with this, if it is determined as a result of the simultaneous test that relief is impossible, the SRAMs 111 to 113 are individually (successively) tested and subjected to replacement analysis. As a result of the replacement analysis, if it is determined that the SRAMs of a number smaller than the number (2 in the third embodiment) of the fuse circuit can be relieved, relief information obtained by the individual test is written in the fuse circuit(s), and fuse selection data is generated. Thereby, all the SRAMs can be relieved and dealt as non-defective items. If it is determined as a result of the individual test that relief is impossible and if SRAMs of a number larger than the number of the fuse circuit can be relieved, the SRAMs are determined as defective items.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:
1. A semiconductor integrated circuit comprising:
a plurality of memory circuits in which defective columns are relievable, mounted on one chip, each of the memory circuits having a multi-bit structure;

a plurality of comparison circuit which are connected to output sides of the respective memory circuits, and compare multi-bit memory data items output from the associated memory circuits with multi-bit expected data;

a logic circuit which consolidates multi-bit comparison results output from the comparison circuits;

a replacement analysis circuit which is shared between the memory circuits, performs replacement analysis by processing multi-bit data output from the logic circuit, and generates relief information to relief the memory circuits; and a nonvolatile storage circuit which stores the relief information, and performs relief for the memory circuits by using the relief information.

2. A semiconductor integrated circuit according to claim 1, wherein
the logic circuit performs AND operation or OR operation for corresponding bits of the multi-bit comparison results output, the bits corresponding to each other between the multi-bit comparison results.

3. A semiconductor integrated circuit according to claim 1, wherein the multi-bit comparison result output from a comparison circuit which has a smaller bit width than the other comparison circuits contains dummy bits corresponding in number to the difference between the bit widths and showing match of data.

4. A semiconductor integrated circuit according to claim 1, wherein the multi-bit comparison result output from a comparison circuit which has a smaller bit width than the other comparison circuits contains no logic structure corresponding in number to the difference between the bit widths.

5. A semiconductor integrated circuit according to claim 1, wherein the nonvolatile storage circuit comprises a plurality of fuse elements.

6. A semiconductor integrated circuit according to claim 1, wherein
the comparison circuits are commonly supplied with a control signal, controlled by the control signal, and forcibly set the multi-bit comparison results to matched data when the control signal is in an inactive state,
the replacement analysis circuit performs the replacement analysis for the respective memory circuits by common activation of the comparison circuits by the control signal, and generates relief information items to relief the memory circuits, and
the nonvolatile storage circuit includes one nonvolatile storage element which stores the relief information.

7. A semiconductor integrated circuit according to claim 1, wherein
the comparison circuits are supplied with respective control signals, individually controlled by the control signals, and forcibly set the multi-bit comparison results to matched data when the control signals are in an inactive state,
the replacement analysis circuit individually performs the replacement analysis for the memory circuits by individual activation of the comparison circuits by the control signals, and generate the relief information items to relief the memory circuits, and
the nonvolatile storage circuit includes a plurality of nonvolatile storage elements which individually store respective relief information items.

8. A semiconductor integrated circuit according to claim 7, further comprising:
a selection circuit which stores memory selection data which designates correspondence indicating which relief information item in the relief information items stored in the nonvolatile memory circuits is used for which memory circuit,
wherein the number of the nonvolatile storage elements is smaller than the number of the memory circuits.

9. A semiconductor integrated circuit according to claim 1, wherein the memory circuits comprises a plurality of RAMs.

10. A semiconductor integrated circuit according to claim 1, wherein the relief information includes an enable bit and an address assigned to a column to be relieved.

11. A semiconductor integrated circuit according to claim 10, wherein the relief information further includes a flag bit showing whether the relief for the column is possible or not.

12. A method of relieving a semiconductor integrated circuit comprising:
comparing a plurality of multi-bit memory data items output from a plurality of memory circuits of a multi-bit structure mounted on one chip with multi-bit expected data to acquire multi-bit comparison results for the memory circuits,
consolidating the multi-bit comparison results output from the comparison circuits to acquire a logic value data of a multi-bit structure,
performing replacement analysis for the memory circuits based on the logic value data output from the logic circuit to generate relief information to relief the memory circuits,
storing the relief information in a nonvolatile storage circuit, and
perform relief for the memory circuits by using the relief information stored in the nonvolatile storage circuit.

13. A method of relieving a semiconductor integrated circuit, according to claim 12, wherein
in comparing the multi-bit memory data items with the multi-bit expected data to acquire multi-bit comparison results, the multi-bit memory data items of the respective memory circuits are compared with multi-bit expected data, bit by bit, and
in consolidating the multi-bit comparison results to acquire the logic value data, bits corresponding to each other between the multi-bit comparison results are consolidated.

14. A method of relieving a semiconductor integrated circuit, according to claim 12, wherein in comparing the multi-bit memory data items with the multi-bit expected to acquire multi-bit comparison results, dummy bits are added to the multi-bit comparison result output from a comparison circuit which has a smaller bit width than the other comparison circuits contains, the dummy bits corresponding in number to the difference between the bit widths and showing match of data.

15. A method of relieving a semiconductor integrated circuit, according to claim 12, wherein
in comparing the multi-bit memory data items with the multi-bit expected data to acquire multi-bit comparison results, a control signal is commonly supplied to a plurality of comparison circuits provided in correspondence to the memory circuits to commonly control the comparison circuits to forcibly set the multi-bit comparison results to matched data when the control signal is in an inactive state, and
in performing the replacement analysis to generate relief information, the replacement analysis for the memory circuits is commonly performed when the control signal is in an active state to generate relief information items to relief the memory circuits.

16. A method of relieving a semiconductor integrated circuit, according to claim 12, wherein in comparing the multi-bit memory data items with the multi-bit expected data to acquire multi-bit comparison results, control signals are correspondingly supplied to a plurality of comparison circuits provided in correspondence to the respective memory circuits to individually control the comparison circuits to forcibly set the multi-bit comparison results to matched data when the respective control signals are in an inactive state, and in performing the replacement analysis to generate relief information, the replacement analysis for the memory circuits is individually performed when the control signals are in an active state to generate relief information items to relief the memory circuits.

17. A method of relieving a semiconductor integrated circuit, according to claim 12, wherein the relief information includes a flag bit showing whether the relief for the column is possible or not.

18. A method of relieving a semiconductor integrated circuit, according to claim 12, wherein in storing the relief information in the nonvolatile storage circuit, a fuse element forming the nonvolatile storage circuit is blown out to store the relief information in the nonvolatile storage circuit.

19. A method of testing a semiconductor integrated circuit, the semiconductor integrated circuit including a plurality of memory circuits in which defective columns are relievable, mounted on one chip, each of the memory circuits having a multi-bit structure; a plurality of comparison circuit which are connected to output sides of the respective memory circuits, and compare multi-bit memory data items output from the associated memory circuits with multi-bit expected data; a logic circuit which consolidates multi-bit comparison results output from the comparison circuits; a replacement analysis circuit which is shared between the memory circuits, performs replacement analysis by processing multi-bit data output from the logic circuit, and generates relief information to relief the memory circuits; and a nonvolatile storage circuit which stores the relief information, and performs relief for the memory circuits by using the relief information, wherein the comparison circuits are supplied with respective control signals, individually controlled by the control signals, and forcibly set the multi-bit comparison results to matched data when the control signals are in an inactive state, the replacement analysis circuit individually performs the replacement analysis for the memory circuits by individual activation of the comparison circuits by the control signals, and generate the relief information items to relief the memory circuits, and the nonvolatile storage circuit includes a plurality of nonvolatile storage elements which individually store respective relief information items, in which the memory circuits are simultaneously tested, it is determined based on a result of the simultaneous test whether the memory circuits are to be individually tested, and the memory circuits are individually tested when it is determined that the memory circuits are to be individually tested.

20. A method of testing a semiconductor integrated circuit, according to claim 19, wherein determination is made not to perform the individual test when it is determined based on a result of the simultaneous test that the memory circuits are all good items, and determination is made to perform the individual test when it is determined based on a result of the simultaneous test that at least one the memory circuits is a defective item.

* * * * *